United States Patent [19]
Soloff et al.

[11] Patent Number: 5,268,905
[45] Date of Patent: Dec. 7, 1993

[54] SUB BAND FILTERS

[75] Inventors: Jonathan M. Soloff, Basingstoke; Jonathan J. Stone, Reading; Terence R. Hurley, Newbury; James H. Wilkinson, Tadley, all of United Kingdom

[73] Assignee: Sony United Kingdom Limited, Staines, United Kingdom

[21] Appl. No.: 885,863

[22] Filed: May 20, 1992

[30] Foreign Application Priority Data

Aug. 23, 1991 [GB] United Kingdom ............... 9118167

[51] Int. Cl.$^5$ ............... H04J 1/00; H04N 7/12
[52] U.S. Cl. ............... 370/123; 370/69.1; 370/70; 358/133; 358/138
[58] Field of Search ............... 370/69.1, 123, 70, 72, 370/76, 118, 120; 375/38; 455/59; 380/34, 38, 39, 40; 364/724.1, 724.13; 381/29, 31, 36, 37; 382/56; 358/12, 133, 138, 141

[56] References Cited

U.S. PATENT DOCUMENTS

| 4,075,429 | 2/1978 | Takahata et al. | 370/70 |
| 4,326,288 | 4/1982 | Fettweis | 370/70 |
| 4,412,325 | 10/1983 | Molo | 370/70 |
| 4,768,187 | 8/1988 | Marshall | 370/120 |
| 4,785,447 | 11/1988 | Ichiyoshi | 370/70 |
| 4,918,524 | 4/1990 | Ansari | 358/133 |
| 5,032,908 | 7/1991 | Miller | 358/133 |
| 5,097,331 | 3/1992 | Chen et al. | 358/138 |
| 5,115,309 | 5/1992 | Hang | 358/133 |

FOREIGN PATENT DOCUMENTS 0155008 9/1985 European Pat. Off.

Primary Examiner—Douglas W. Olms
Assistant Examiner—Alpus H. Hsu
Attorney, Agent, or Firm—William S. Frommer; Alvin Sinderbrand

[57] ABSTRACT

A sub-band filter system in which the frequency separated data is multiplexed together at the output of each filter stage. The stream of multiplexed data produced can have a block-by-block format or a sample-by-sample format. In the latter case, the filtering can be effected by a finite impulse response filter with switchable tap coefficients for effecting both decimation and high and low pass filtering.

21 Claims, 16 Drawing Sheets

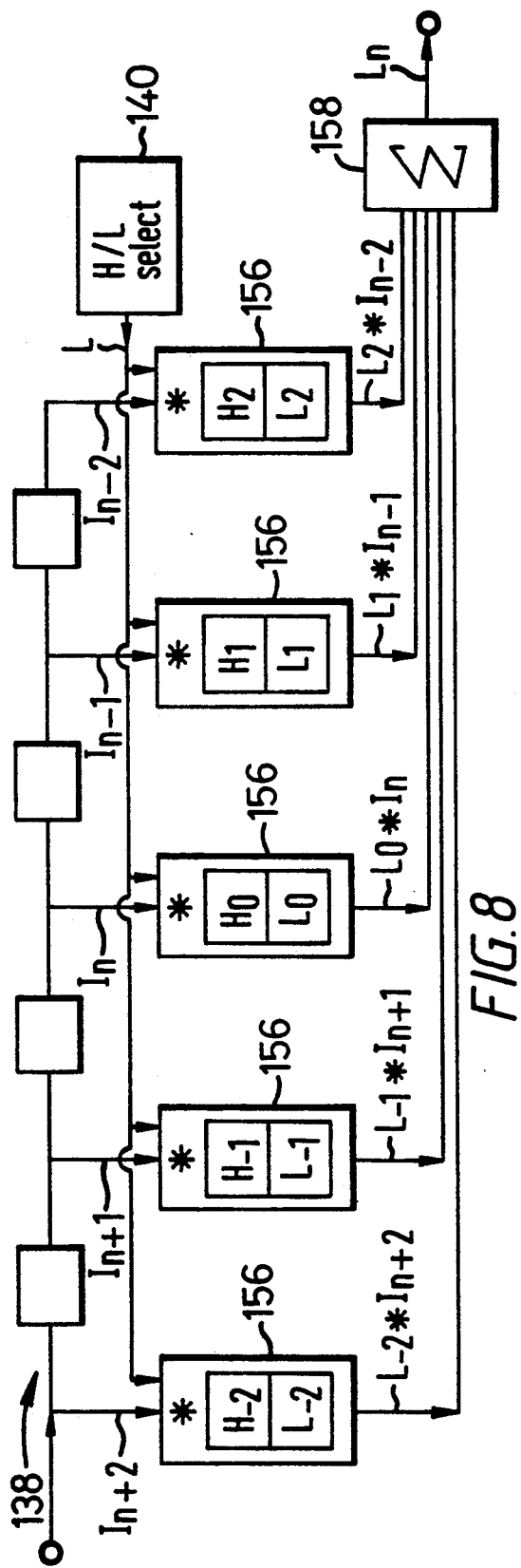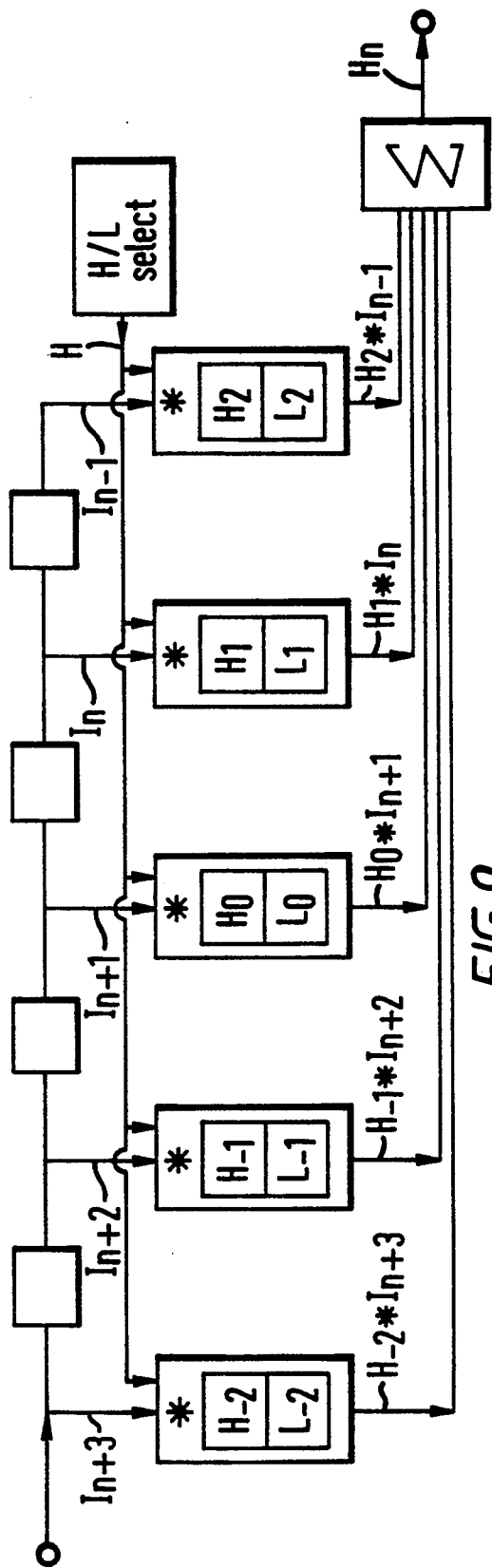
FIG.8
FIG.9

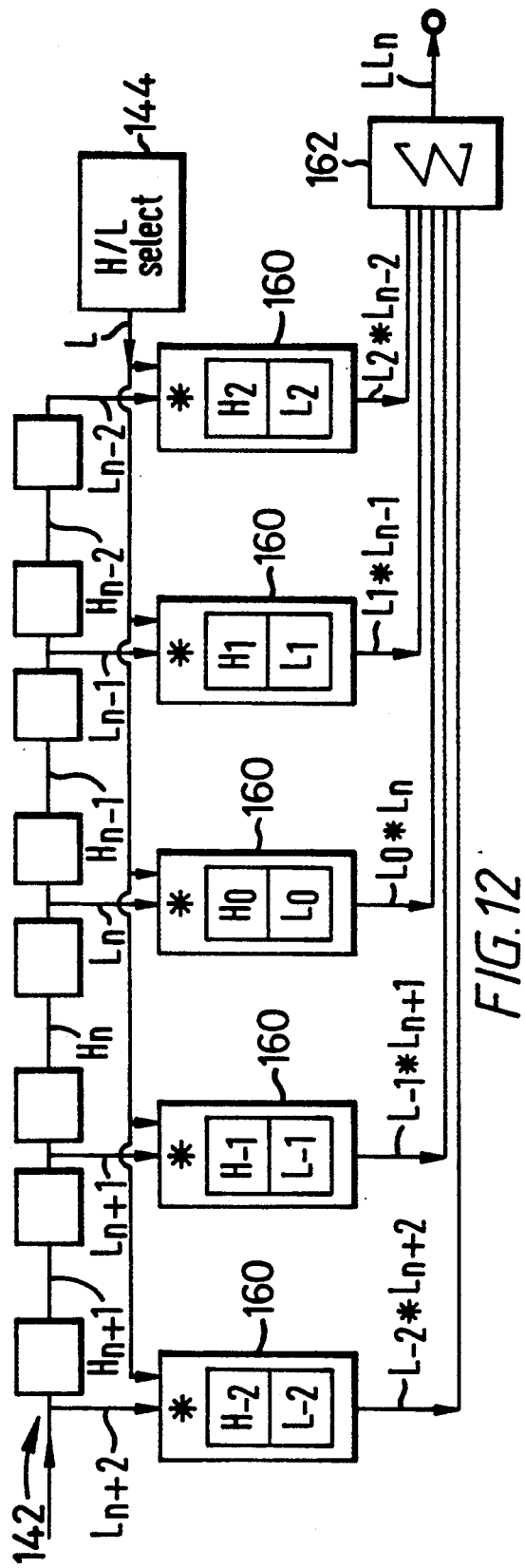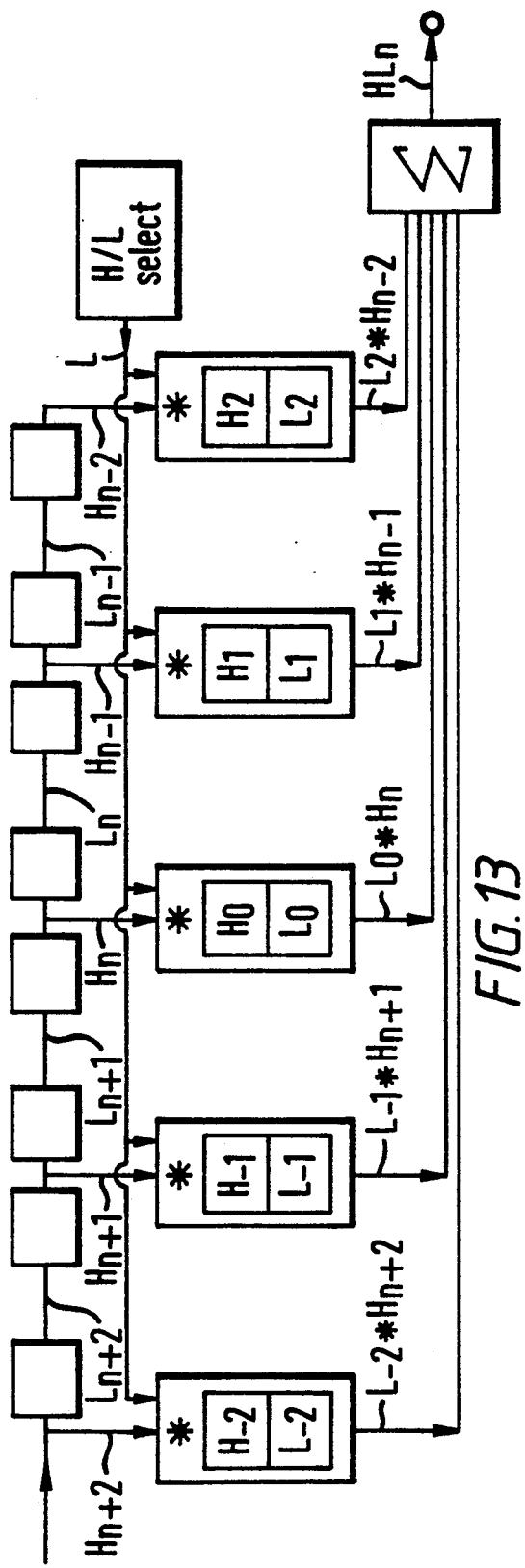

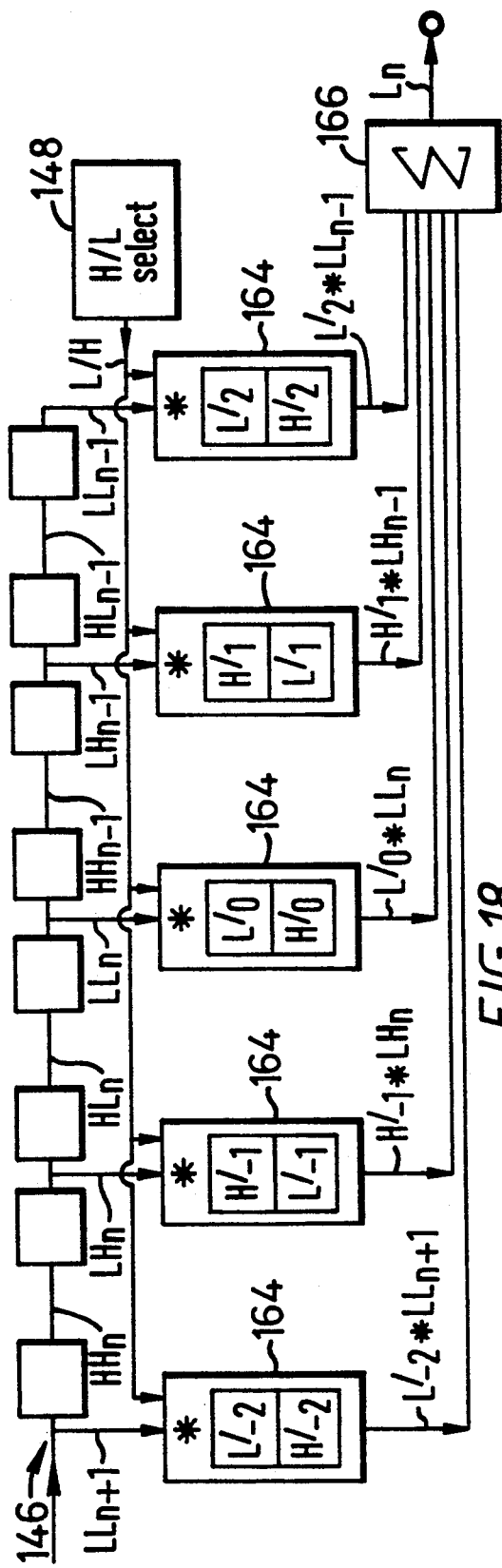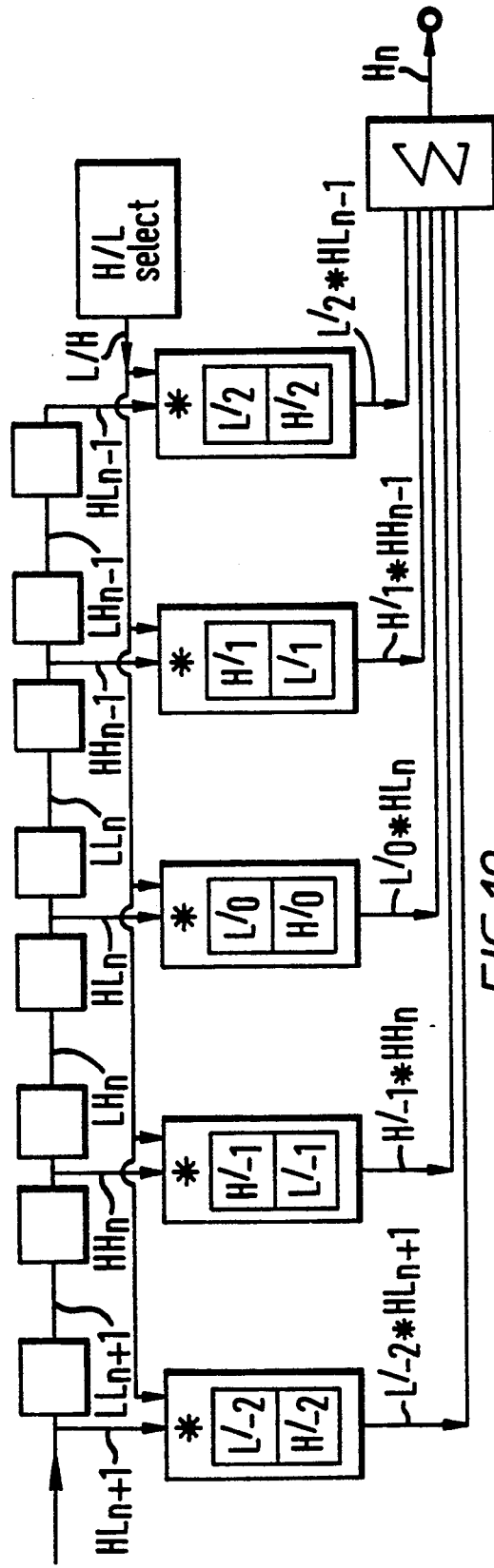
FIG.18
FIG.19

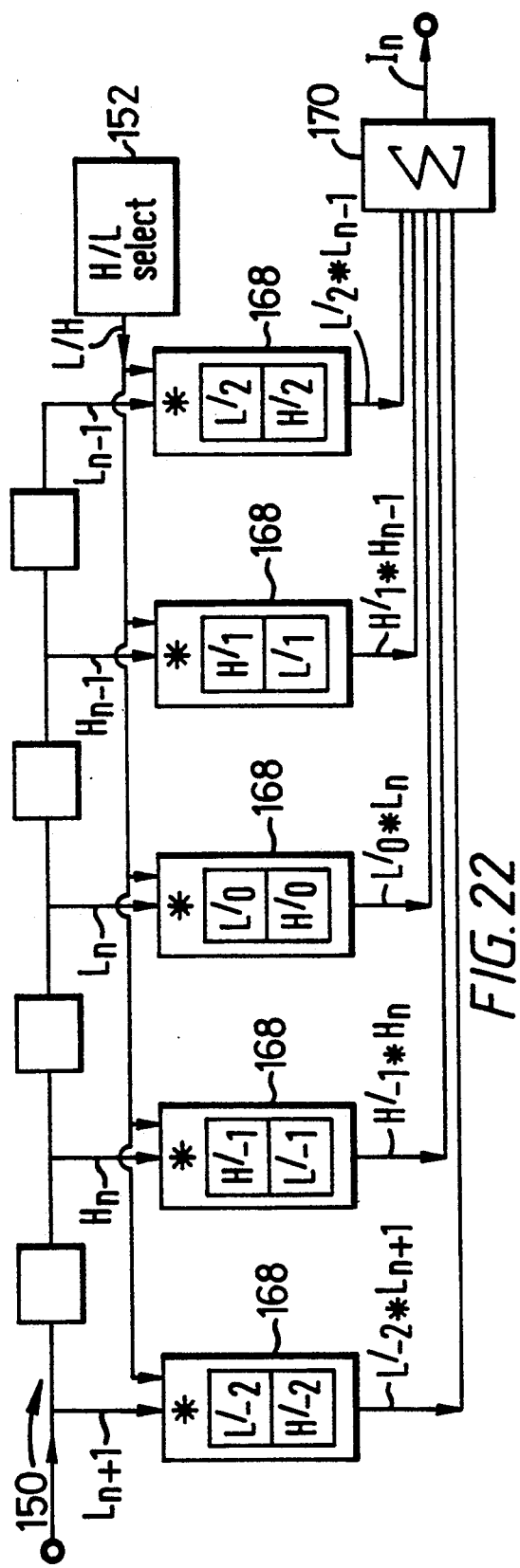
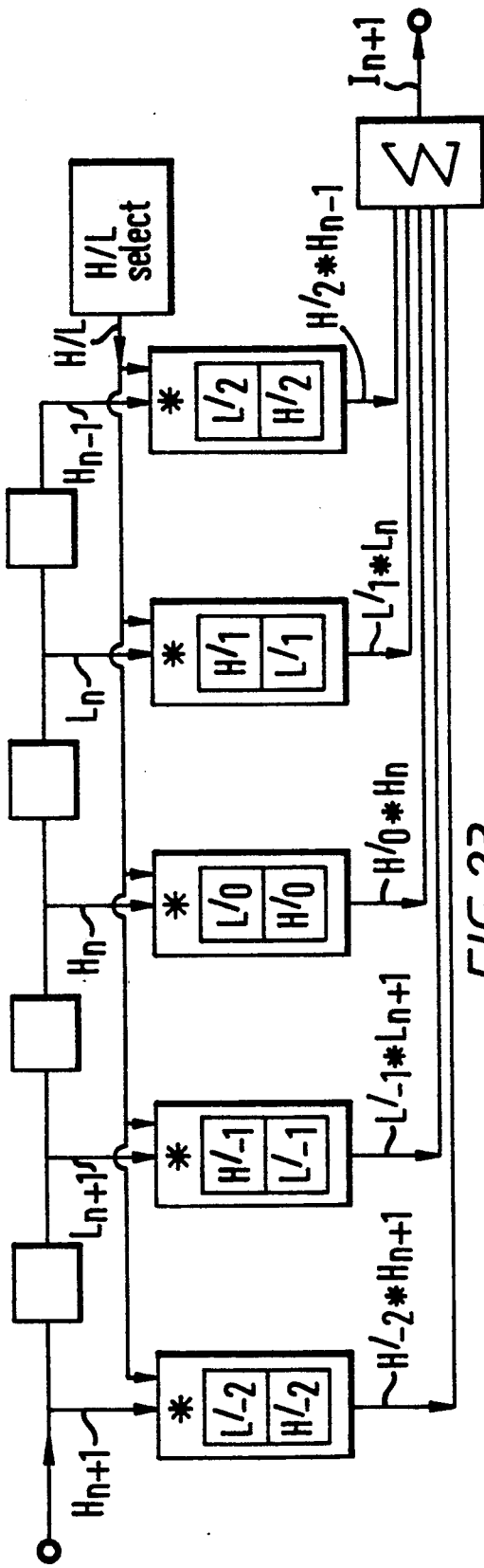
FIG.22
FIG.23

SUB BAND FILTERS

BACKGROUND OF THE INVENTION

1. Field of the Invention

This invention relates to the field of sub band filtering. More particularly, this invention relates to the flow of data through sub band filters.

2. Description of the Prior Art

Sub band filtering is a process by which a signal is divided into a number of consecutive bands in the frequency domain. In one known application, these bands are processed independently to produce a compressed representation of the original signal, and later reconstructed, using further filters, to reproduce the original signal. For example, sub band filtering may be used to carry out decorrelation of image data in the two dimensional spatial frequency domain within an image data compression system.

Known multi-stage sub band filters, based on separate filter banks, are arranged in a tree structure as shown in FIG. 1. Each stage in the filter further divides the data into more sub bands. In the example shown, which is based upon high and low pass filters, each stage doubles the number of sub bands into which the data is divided.

Such known arrangements involve the disadvantageous use of a large amount of hardware. Also, at each separation stage, the sample throughput rate is reduced by a factor of two on that for the previous stage. Similarly, at each combination stage, sample throughput rate is increased by a factor of two on that for the previous stage. Thus, the known arrangements use a large amount of hardware, most of which is inefficiently operating at below its maximum capacity.

SUMMARY OF THE INVENTION

Viewed from a first aspect the invention provides a sub band separation filter comprising one or more filter stages, each said filter stage including:

(i) one or more filter elements for frequency separating a stream of input data into frequency separated data representing different frequency components of said stream of input data; and (ii) means for multiplexing said frequency separated data to form a stream of multiplexed data.

The invention provides for a reduction in the amount of hardware required, and an increase in the sample throughput rate, at each stage subsequent to the first stage. In order to realise this advantage the data output from each stage is multiplexed together in a manner which can be exploited by subsequent combined processing in the following filter stages. In some embodiments the multiplexing together of the output data can also lead to advantages in a single stage system by removing the need to provide a separated decimator for reducing the sample rate in the sub band data streams.

In one class of embodiments of the invention the advantages of a reduction in hardware can be realised utilising mostly standard hardware. In such systems said one or more filter elements comprise a plurality of discrete filter elements for producing discrete streams of frequency separated data. These embodiments allow for the continued use of known, and well developed, high and low pass filters. A particularly suitable form for the filter elements is that of finite impulse response filters.

With discrete filter elements producing discrete streams of frequency separated data, a convenient way of effecting multiplexing is that said means for multiplexing includes a data store for storing said discrete streams of frequency separated data and means for reading a sequence of blocks of data originating from within different discrete streams of frequency separated data out of said data store to form a stream of block multiplexed data.

With discrete filter elements producing discrete streams of frequency separated data with a lower maximum frequency content than the input signal, there is no need to preserve as high a sample rate on the outputs as for the input. Thus, preferred embodiments further comprise a decimator disposed between each said discrete filter element and said means for multiplexing.

With such multiplexed data in accordance with the invention, efficient multistage filters cna be effected with each said stream of multiplexed data being processed as a stream of input data by a subsequent filter stage.

Another particularly preferred class of embodiments of the invention allows an advantageous hardward saving within each stage as well as between stages. In such systems said one or more filter elements comprise a finite impulse response filter with a switchable set of tap coefficients values for effecting different frequency responses and said means for multiplexing comprises means for switching said set of tap coefficient values between a periodic sequence of states to control said finite impulse response filter to produce said stream of multiplexed data with a matching periodic sequence of portions corresponding to different frequency components of said stream of input data.

Providing a finite impulse response filter with switchable tap coefficients allows it to perform the role of a plurality of individual conventional filters. In addition, the switching of the tap coefficient provides automatic decimation and multiplexing on a sample-by-sample basis.

In a multistage system, the sample-by-sample multiplexing format imposes certain constraints, e.g. each said subsequent filter stage has a finite impulse response filter with an intertap delay substantially equal to an integer multiple of the period of said stream of multiplexed data being processed as said stream of input data; and said subsequent filter stage has means for switching said tap coefficients in a sequence with a period substantially equal to an integer multiple of the period of said stream of multiplexed data being processed as said stream of input data.

It will be appreciated that the sub band filters of the invention are particularly suitable for the processing of image data due to the high performance demands usually placed upon such systems.

What has been described above in terms of sub band separation filters is equally true of sub band combination filters, and viewed from a second aspect the invention provides a sub band combination filter comprising one or more filter stages, each said filter stage including:

(i) means for demultiplexing a stream of multiplexed data formed of frequency separated data representing different frequency components of a stream of source data; and (ii) one or more filter elements for frequency combining said frequency separated data into a stream of output data corresponding to said stream of source data.

Viewed from a third aspect the invention provides a sub band separation method for use within each filter stage of a sub band separation filter comprising one or more filter stages, said sub band separation method comprising the steps of:

(i) frequency separating a stream of input data into frequency separated data representing different frequency components of said stream of input data; and (ii) multiplexing said frequency separated data to form a stream of multiplexed data.

Viewed from a fourth aspect the invention provides a sub band combination method for use within each filter stage of a sub band combination filter comprising one or more filter stages, said sub band separation method comprising the steps of:

(i) demultiplexing a stream of multiplexed data formed of frequency separated data representing different frequency components of a stream of source data; and (ii) frequency combining said frequency separated data into a stream of output data corresponding to said stream of source data.

The above, and other objects, features and advantages of this invention will be apparent from the following detailed description of illustrative embodiments which is to be read in connection with the accompanying drawings.

BRIEF DESCRIPTION OF THE DRAWINGS

FIGS. 8 to 11 show an example of the flow of data through stage one of the sub band separation filter illustrated in FIG. 6;

FIGS. 12 to 15 show an example of the flow of data through stage two of the sub band separation filter illustrated in FIG. 6;

FIGS. 18 to 21 show an example of the flow of data through stage two of the sub band combination filter illustrated in FIG. 7;

FIGS. 22 to 25 show an example of the flow of data through stage one of the sub band combination filter illustrated in FIG. 7.

DESCRIPTION OF THE PREFERRED EMBODIMENTS

Figure 1:
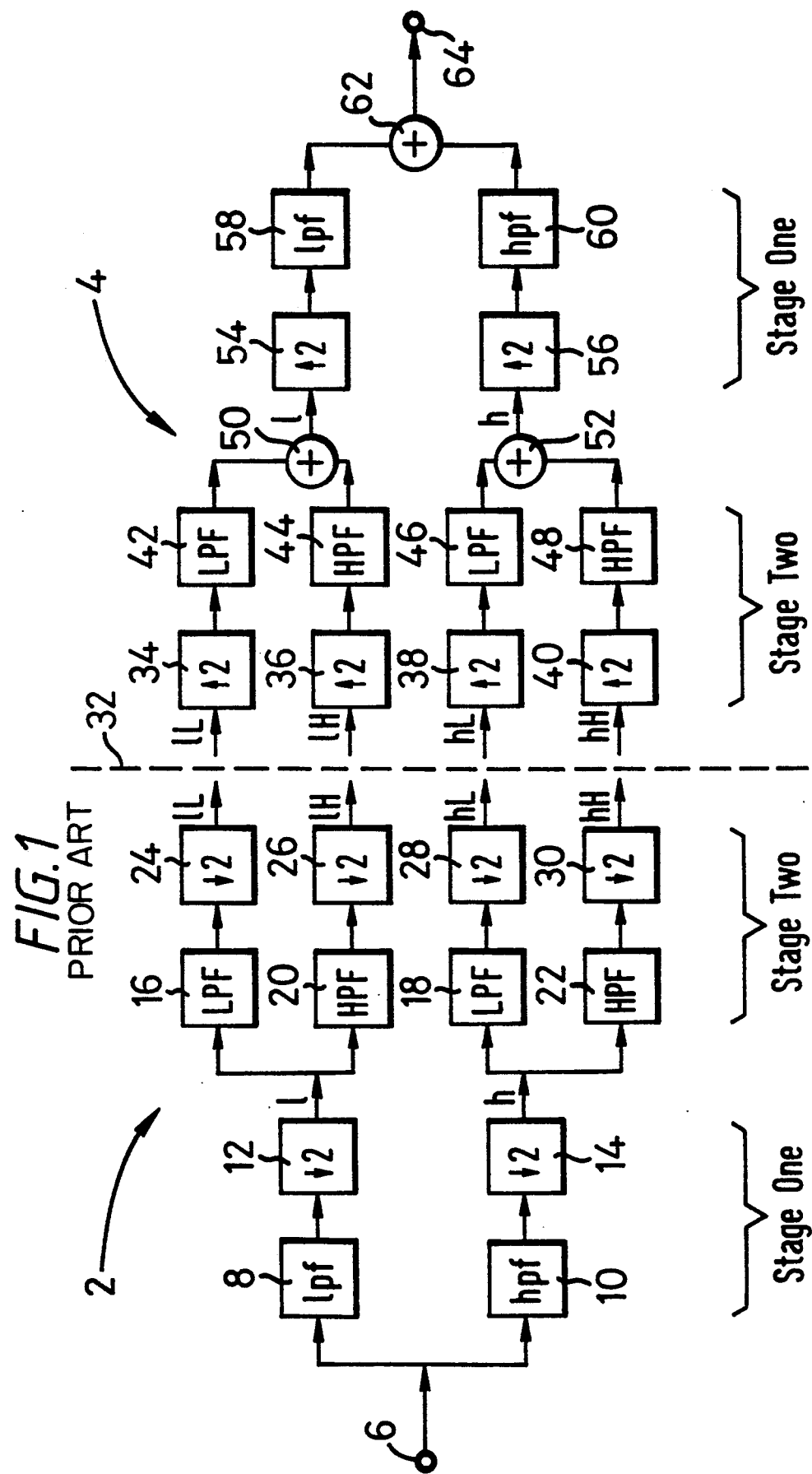
FIG. 1 illustrates a tree structured sub band filter system.

FIG. 1 shows a tree structured sub band filter system comprising a sub band separation filter 2 and a sub band combination filter 4. A stream of input data is fed to the sub band separation filter 2 via an input node 6. The stream of input data is fed to a stage one low pass filter (lpf) 8 and a stage one high pass filter (hpf) 10. The output from the lpf 8 represents the frequency separated low frequency component of the stream of input data. The output from the hpf 10 represents the frequency separated high frequency component of the stream of input data. The output from the lpf 8 is fed to a decimator 12 where every alternate sample is removed from the data stream. The output from the hpf 10 is fed to a decimator 14 where every alternate data value is removed from the data stream. The output from stage one of the sub band separation filter 2 is two decimated, frequency separated frequency components of the stream of input data.

Stage two of the sub band separation filter includes two stage two low pass filters (LPF) 16, 18 and two stage two high pass filters (HPF) 20, 22. The output from each one of the lpf 8 and the hpf 10 is treated as a stream of input data by a respective pair of a LPF and a HPF 16, 20; 18, 20 in stage two. Each of the streams of data being fed to stage two is at half the data rate of the stream of input data at the input node 6. Thus, each of the LPFs 16, 18 and the HPFs 20, 22 operates with a multiplication rate half that of the lpf 8 and the hpf 10 in stage one.

The outputs from the LPFs 16, 18 and HPFs 20, 22 are fed to respective decimators 24, 26, 28, 30 where every alternate data value is removed from the data stream. The overall output from the sub band separation filter 2 is four streams of data representing respective frequency bands within the stream of input data and each having a sample rate of one quarter of the sample rate of the stream of input data.

The four sub band components may then be independently processed e.g. transmitted, compressed, stored or analyzed. This separate processing is illustrated by the dashed line 32 in FIG. 1.

When it is desired to reconstruct the original stream of input data the four sub band components are fed to stage two of the sub band combination filter 4. Each of the data streams passes through a padder 34, 36, 38, 40 where the data rate is doubled and values of zero are inserted between each data value input to the respective padder. The padded data streams are then fed to respective LPFs 42, 46 and HPFs 44, 48. The outputs from the LPF 42 and the HPF 44 are summed in an adder 50. The outputs from LPF 46 and HPF 48 are summed in a adder 52. The output from stage two of the sub band combination filter 4 is two data streams representing the frequency separated high and low frequency components of the original stream of input data. Each of these streams of component data has a sample rate half that of the stream of input data.

The outputs from stage two of the sub band combination filter 4 are fed to further padders 54, 56 and a respective lpf 58 and hpf 60. The outputs from the lpf 58 and the hpf 60 are fed to an adder 62 where they are summed together. The output on output node 64 is a reconstructed version of the original stream of input data. If perfect reconstruction filters are used, then the signal on output node 64 should be an essentially true representation of the stream of input data. The individual low and high pass filter elements within the sub band filter system are finite impulse response filters with tap coefficients chosen to yield their desired frequency response in the known manner.

It will be seen that the tree structured filter system of FIG. 1 includes twelve filter elements and decimators/padders, eight of which are operating at a data rate only half that of the data rate of the input stream of data. This represents an inefficient hardware implementation. This inefficiency becomes even more pronounced in a three stage tree structured filter. In this case, there would be twenty eight filter elements and decimators with only four operating at the rate of the stream of input data. In general, each side of an n stage tree structured filter system will have $2(2^n - 1)$ filter elements and decimators with only two operating at the rate of the stream of input data.

Figure 2:
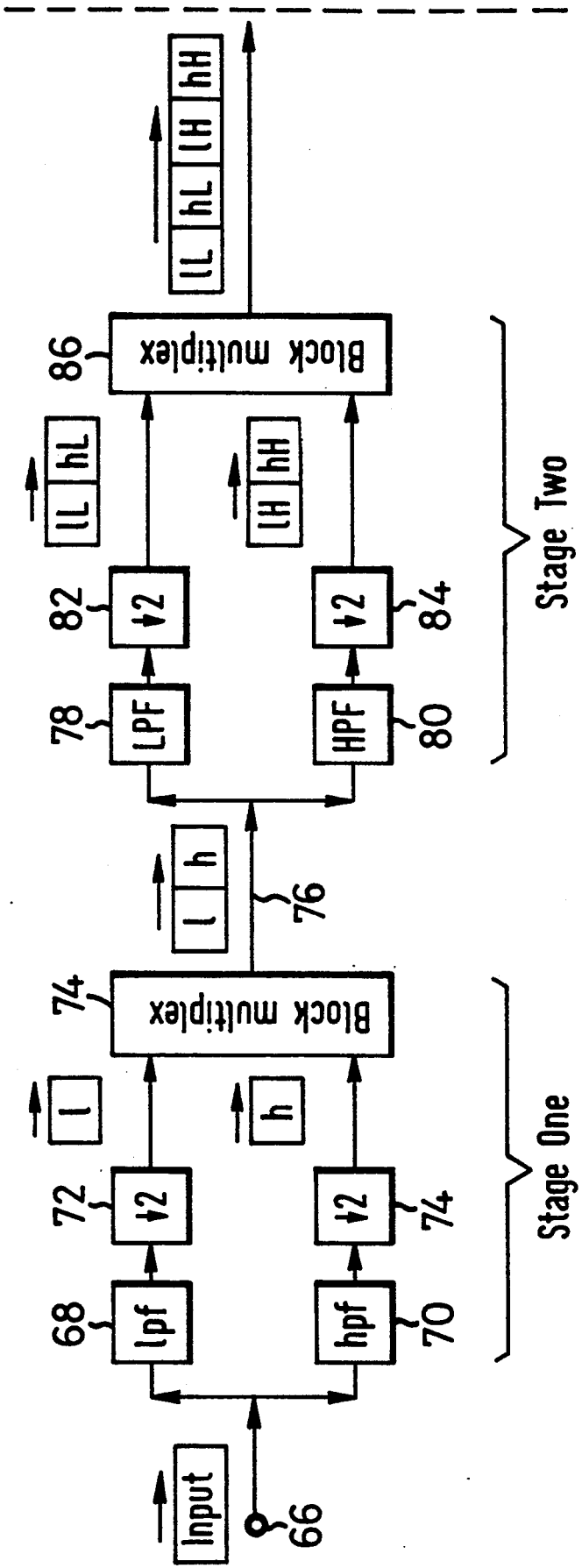
FIG. 2 illustrates to a two stage sub band separation filter in accordance with a first embodiment of the invention.

FIG. 2 illustrates a sub band separation filter in accordance with a first embodiment of the invention. A stream of input data is fed to stage one of the filter via an input node 66. This input data is fed to both a lpf 68 and a hpf 70 as in the filter of FIG. 1. Once again, the outputs from the lpf 68 and the hpf 70 are fed to respective decimators 72, 74 where they are data rate reduced. The data rate reduced, frequency separated low and high frequency components of the stream of input data are fed to a block multiplexer unit 74. The block multiplexer unit 74 stores a line of input data from each channel and block multiplexes these together onto a single channel 76 with successive blocks originating from alternating high and low pass channels within stage one.

This stream of multiplexed data on channel 76 is fed as the input to stage two. Stage two may be identical in structure to stage one with a LPF 78, a HPF 80, decimators 82, 84 and a block multiplexer unit 86. The stream of multiplexed data output from stage one is processed in stage two in the same manner that the stream of input data was processed in stage one. The stage two block multiplexer unit 86 produces an output which is a block multiplexed representation of four streams of sub band component data. The position within the stream of output data determines from which sub band the data at that position originates. The stream of multiplexed data is then passed out of the system for transmission, storage or the like as previously discussed.

Figure 3:
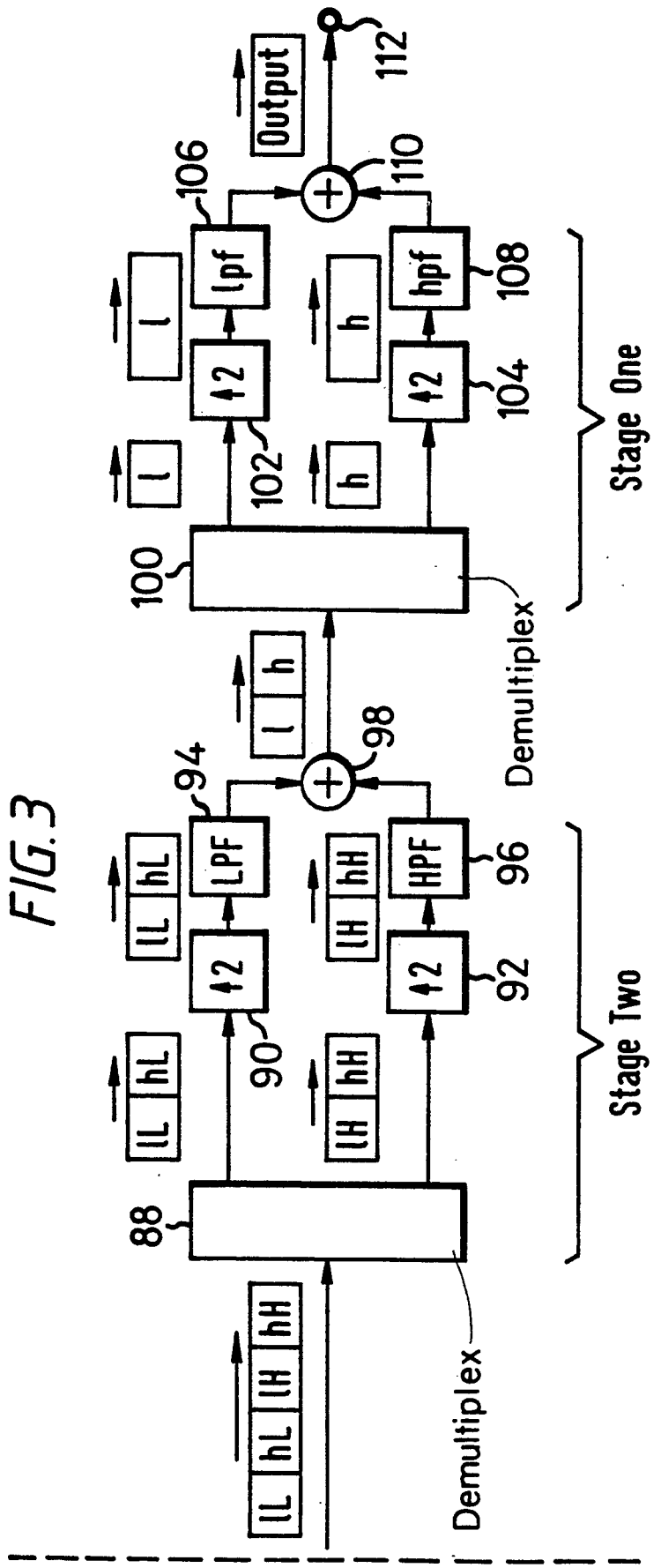
FIG. 3 illustrates a two stage sub band combination filter in accordance with a first embodiment of the invention.

FIG. 3 illustrates a two stage sub band combination filter in accordance with a first embodiment of the invention. The stream of multiplexed data produced by the two stage sub band separation filter of FIG. 2 is input to a block demultiplexer 88. The block demultiplexer 88 sends the first part of each line of data through the low pass path and the second part of each line of data through the high pass path. The two streams of data then pass through padders 90, 92 where their data rate is doubled by the insertion of zeros between the data samples. The output from the padders 90, 92 passes to a respective one of the LPF 94 and the HPF 96. The output from the LPF 94 and the HPF 96 is fed to an adder 98. The output of the summation unit is equivalent to the output of stage one of the two stage sub band separation filter of FIG. 2.

The output from stage two is then passed to the block demultiplexer 100 of stage one. Stage one may be structurally the same as stage two with corresponding padders 102, 104, lpf 106, hpf 108 and adder 110. Stage one processes the data fed to it in the same way as did stage two. The output from stage one is passed to an output node 112. The stream of output data at the output node represents the stream of input data initially fed to the input node 66.

The lpfs, hpfs, LPFs and HPFs of FIGS. 2 and 3 are finite impulse response filters. If the tap coefficients of these filters are appropriately set in the known manner, then the sub band filter system will have so called perfect reconstruction properties. It will be noted that each stage of the filter system of FIGS. 2 and 3 contains only two finite impulse response filters and two decimators/padders. In general an n stage filter will have 2n finite impulse response filters and decimators/padders. Thus, there is a linear relationship between the number of stages and the amount of hardware required to implement the filter. In contrast, with the tree structured sub band filter system of FIG. 1 the amount of hardware required increases exponentially with the number of stages in the filter.

It is also of note that the finite impulse response filters of the sub band filter system of FIGS. 2 and 3 are all operating at the same rate as the sample rate of the stream of input data. Thus, more efficient use is made of the reduced amount of hardware present in the system.

Figure 4:
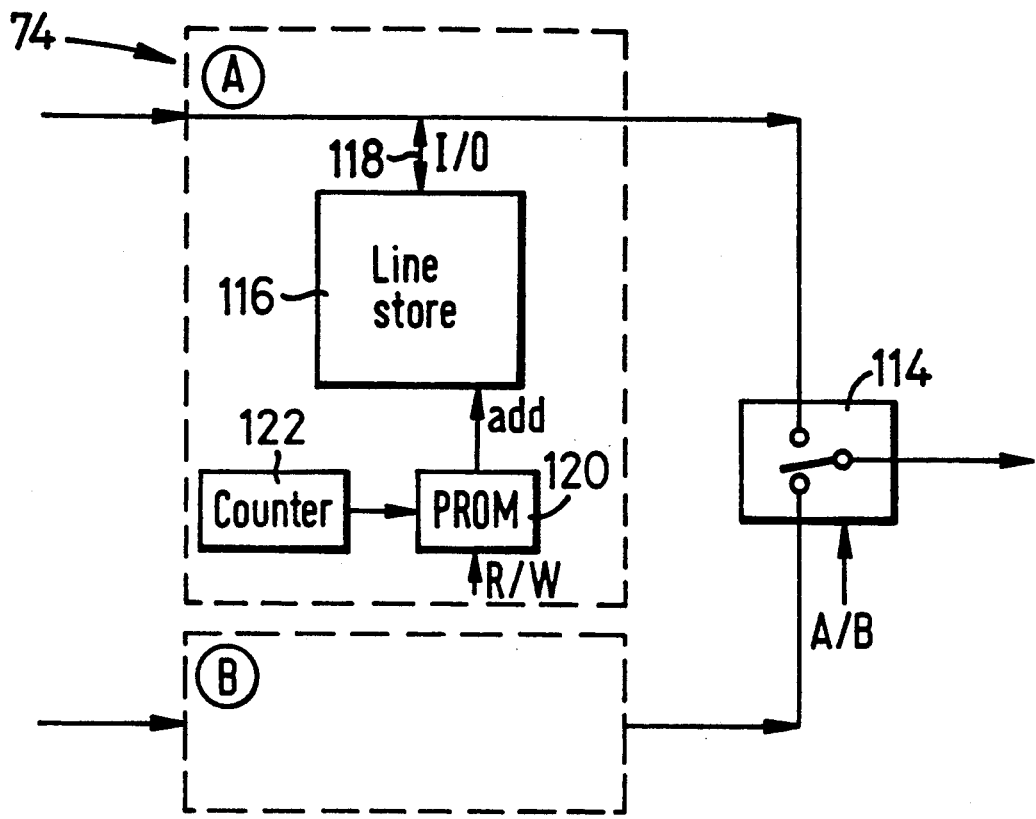
FIG. 4 illustrates in more detail a block multiplexing element from the embodiment of FIG. 2.

FIG. 4 illustrates one of the block multiplexer units of FIG. 2 in more detail. The block multiplexer can be considered to comprise two identical parts A and B. Only one of these parts is fully illustrated. The two parts A and B effectively form a swing buffer arrangement with the output being selected via a switch 114.

Within part A, the input data passes into and out of a line store 116 via an I/O channel 118. The address within the line store 116 to which data is written, or from which data is read, is controlled by a PROM 120. A counter 122 provides an incrementing input to the PROM 120 which is mapped via a table stored within the PROM 120 into an address within the line store. An input R/W controls whether the PROM references a read map or a write map depending upon whether data is being read from the line store or written to the line store.

The block multiplexer of FIG. 4 also performs the function of a decimator, although these have been illustrated separately in FIG. 2. The block multiplexer reads in data at the full rate at which it is input, but when outputting, the block demultiplexer only reads every alternate value from the line store thereby effecting a decimation by a factor of two.

Figure 5:
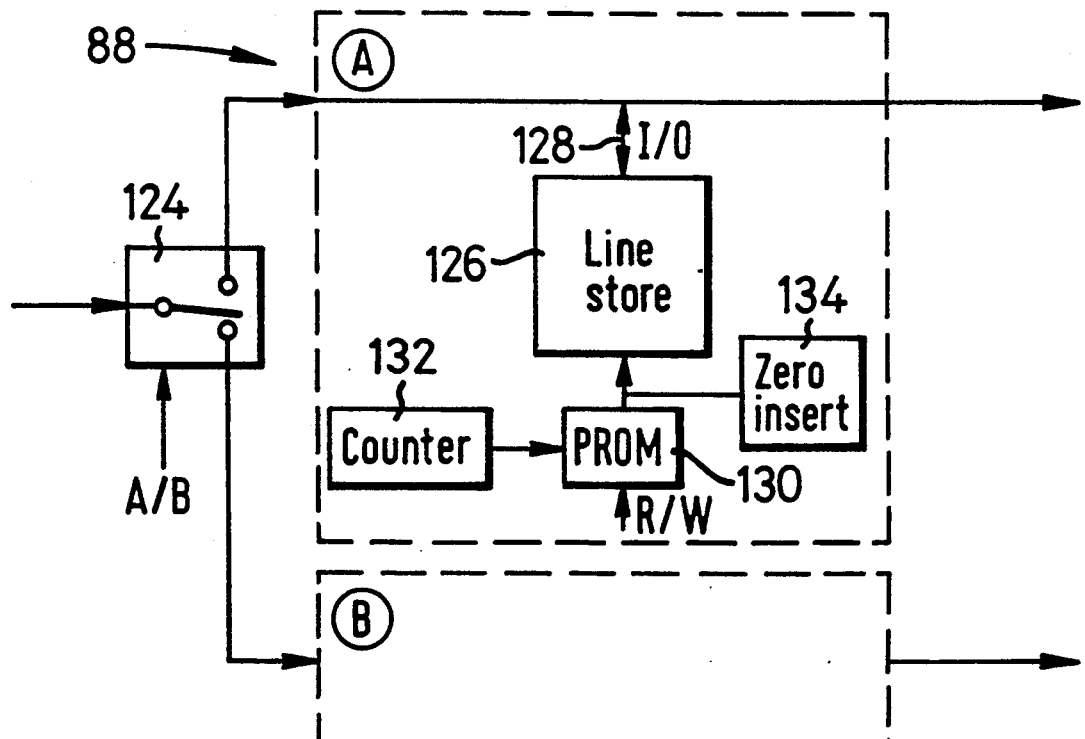
FIG. 5 illustrates in more detail a block demultiplexing element from the embodiment of FIG. 3.

FIG. 5 illustrates a block demultiplexer of FIG. 3 in more detail. As for the block multiplexer of FIG. 4, the block demultiplexer comprises two identical parts A and B, only one of which is shown in detail. The input data is fed to a switch 124 which directs the data to either part A or part B in dependence upon a signal A/B fed to the switch 124. The input to part A is read into a line store 126 via an I/O channel 128. A PROM 130 controls the address within the line store 126 to which data is written to or read from. As before, a counter 132 generates a sequence of numbers which are mapped to addresses by the PROM 130.

The block demultiplexer also performs the function of the padders of FIG. 3, although the padders are illustrated as separate entities in FIG. 3. The block demultiplexer performs the function of a padder by inserting a zero between every data sample read out of the line store 126 using the zero insert unit 134. The zero insert unit 134 is responsive to the output of the PROM 130, and when the PROM is in read mode every alternate output from the PROM 130 triggers the zero insert unit 134 to output a zero value into the data stream.

In summary, the sub band filter system of the embodiment of FIGS. 2 to 5 effects block multiplexing of the data between stages into a single channel with consequential savings in hardware and increased efficiency.

Figure 6:
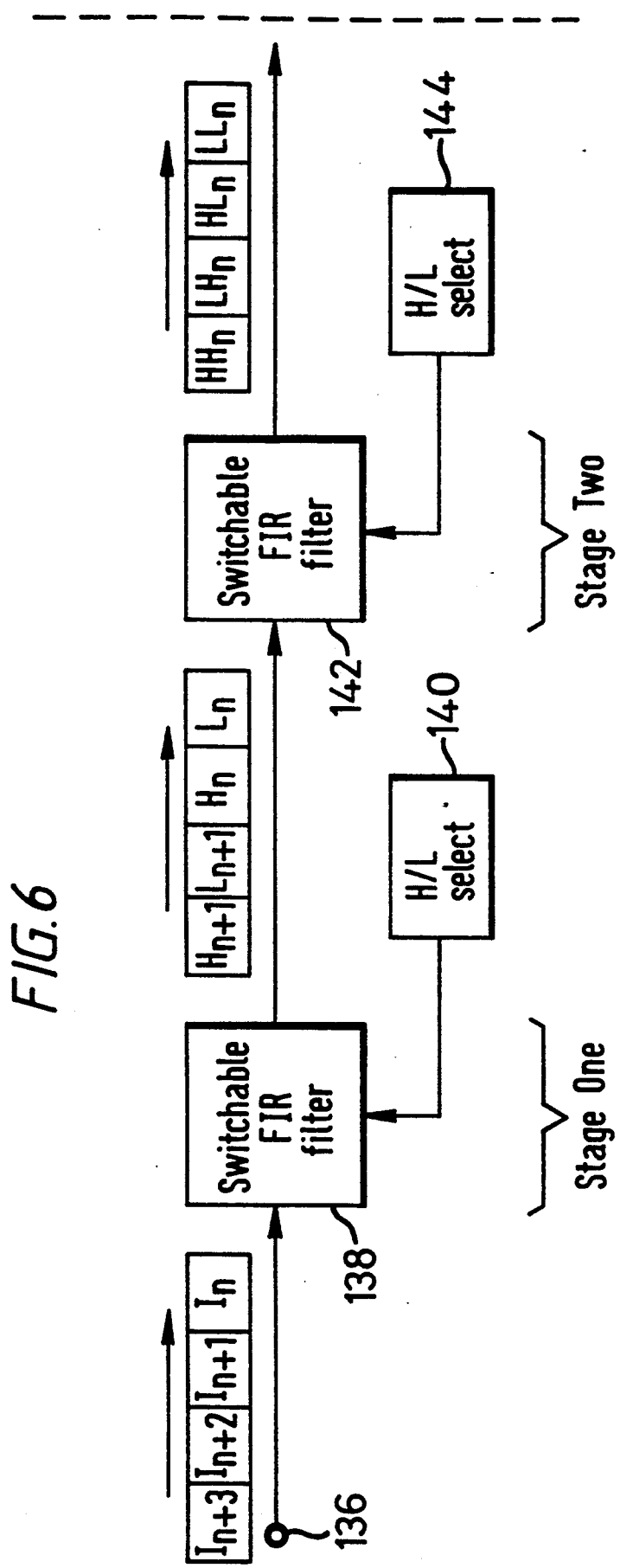
FIG. 6 illustrates a two stage sub band separation filter in accordance with a second embodiment of the invention.

FIG. 6 illustrates a two stage sub band separation filter in accordance with a second embodiment of the invention. Input data at an input node 136 is shown in the form of a sequence of sample values $I_n$. Stage one of the filter comprises a single finite impulse response filter 138 with tap coefficients switched between different sets of coefficients in dependence upon the output of a H/L select unit 140. The H/L select unit 140 of stage one switches the tap coefficients at the same rate as the rate of the stream of input data. The sets of tap coefficients within the switchable finite impulse response filter 138 are a low pass tap coefficient set and high pass tap coefficient set of the known type.

The effect of switching the tap coefficients is to effectively provide both a high pass filter and a low pass filter with a single piece of hardware. Each of these two different sorts of filters is present in the data stream for only half of the time. The output of the switchable finite impulse response filter 138 comprises a sequence of low filtered values and high filtered values multiplexed together on a sample-by-sample basis.

The switching of the tap coefficients also has the effect of decimating the sub band data since the switchable finite impulse response filter 138 is only generating data for each sub band for half of the time.

The output from stage one is fed to stage two. Stage two comprises another switchable finite impulse response filter 142 and H/L select unit 144. The intertap delay of the switchable finite impulse response filter 142 of stage two is double that of the switchable finite impulse response filter 138 of stage one. The H/L select unit 144 switches the tap coefficients at half the rate as for stage one. The sets of tap coefficients themselves are the same as in stage one.

The output from the switchable finite impulse response filter 142 comprises a sequence of data values from four sub bands multiplexed together on a sample-by-sample basis. Once again, the switching of the tap coefficient sets effects decimation of the sub band data.

The hardware requirement for this second embodiment is particularly low, with only a single finite impulse response filter required for each stage, and no separate requirement for a decimator. In addition each finite impulse response filter is operating at the full input data rate.

Figure 7:
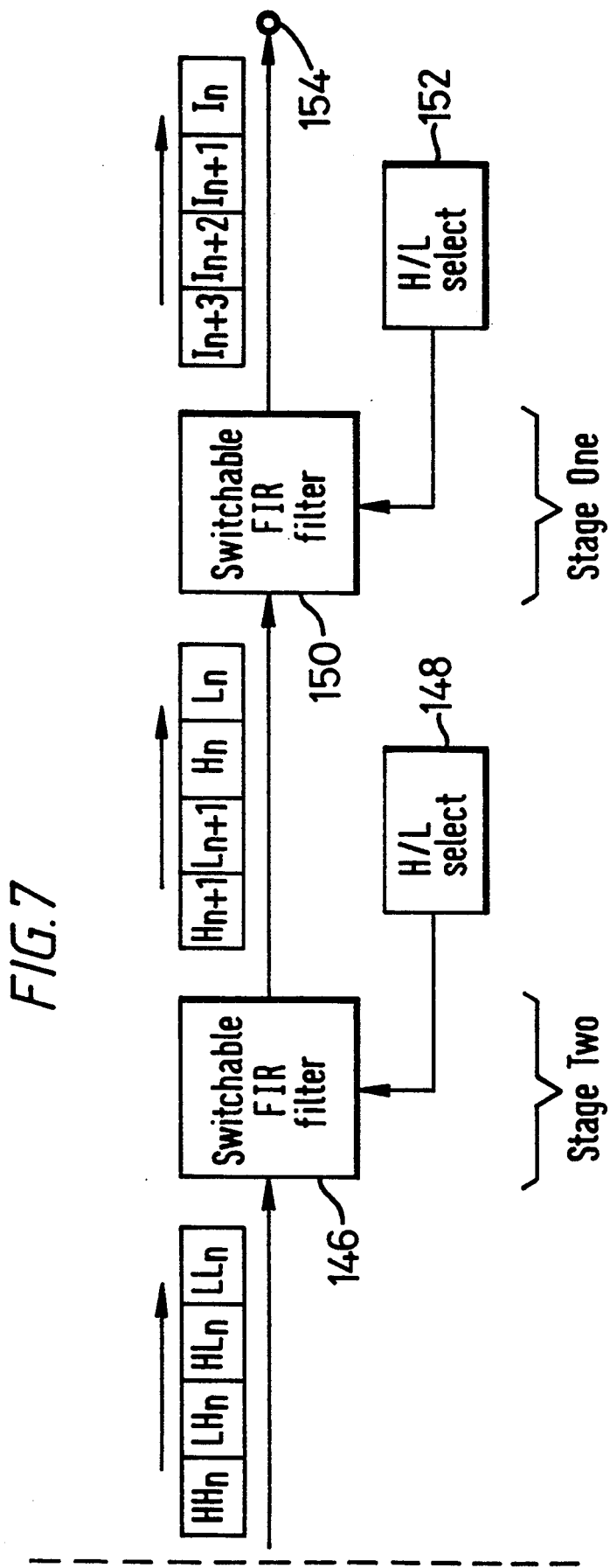
FIG. 7 illustrates a two stage sub band combination filter in accordance with a second embodiment of the invention.
Figure 10:
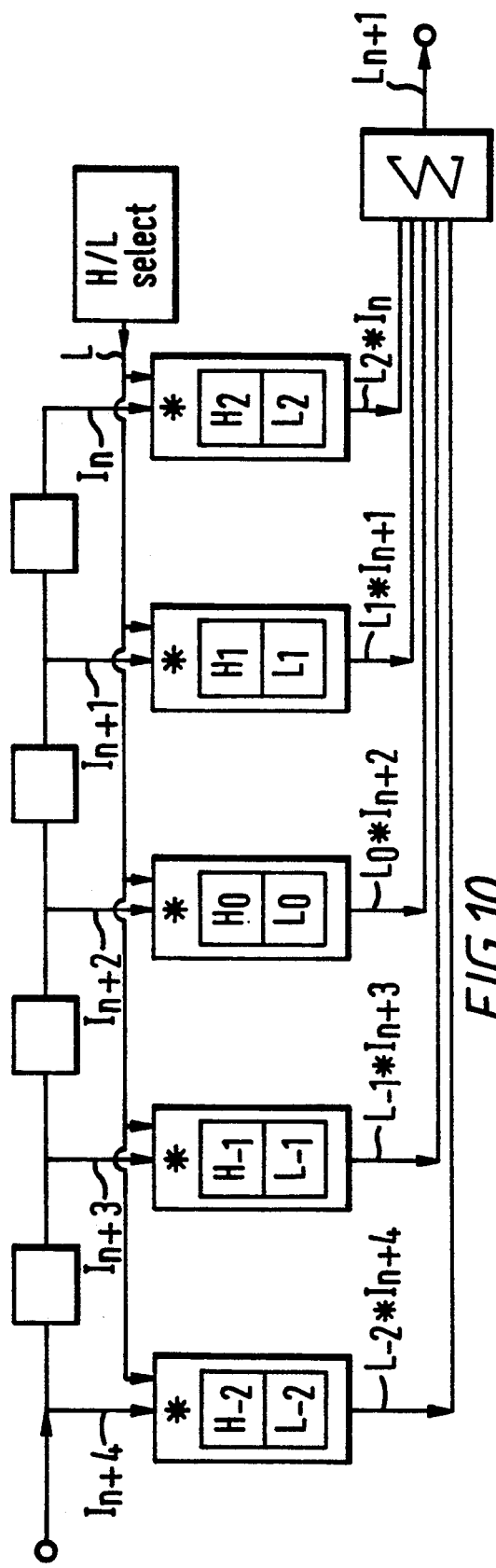
Figure 11:
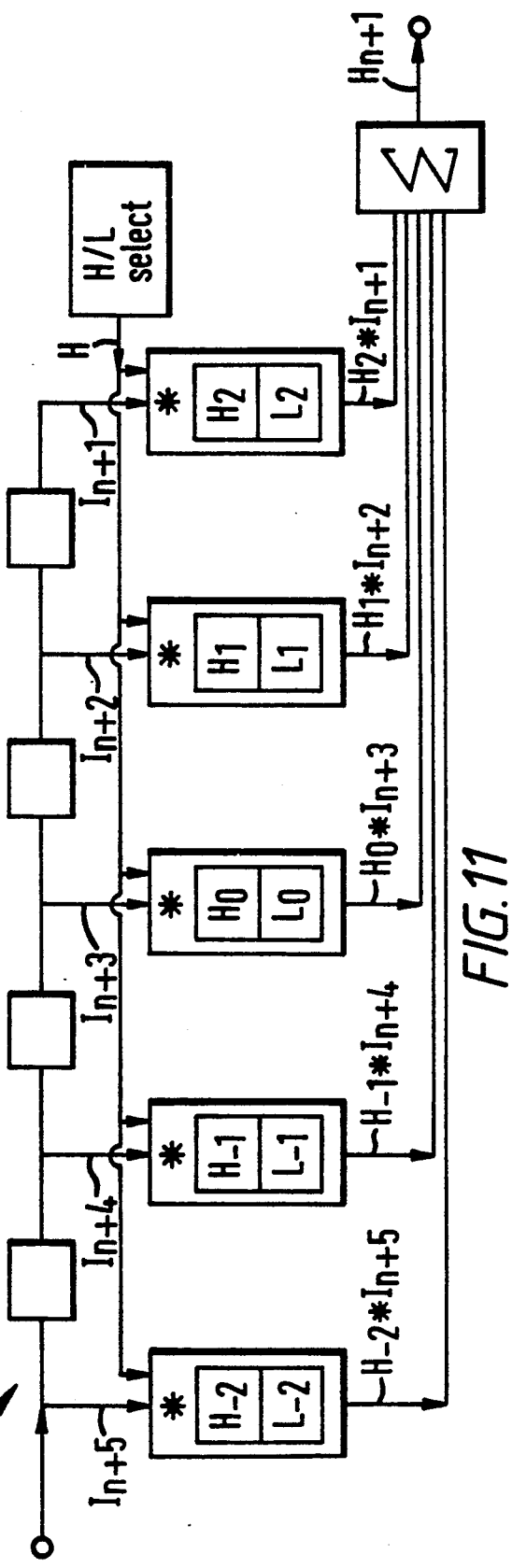
Figure 14:
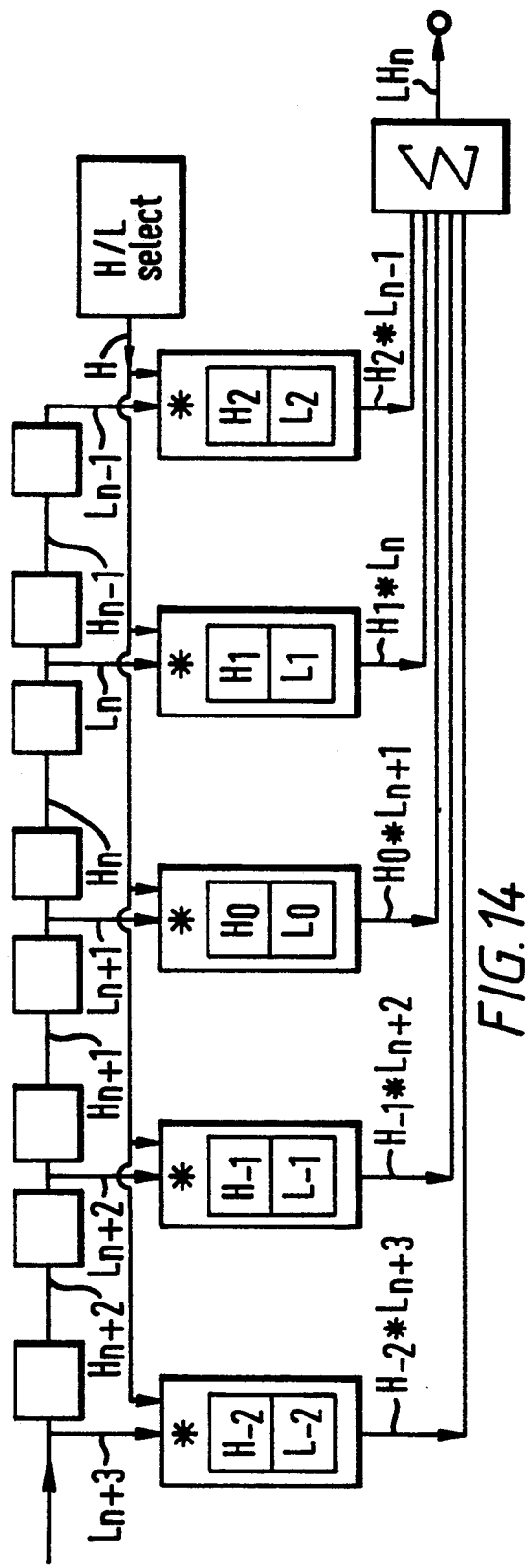
Figure 15:
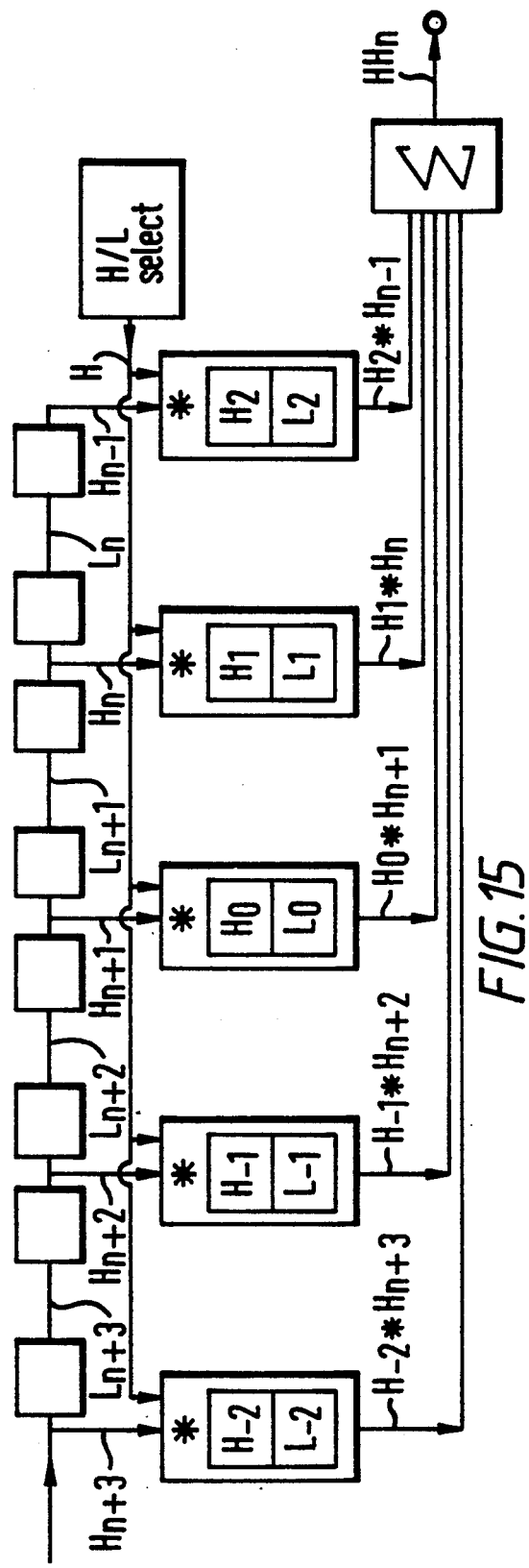

FIG. 7 illustrates a two stage sub band combination filter for processing the sample-by-sample multiplexed data generated by the sub band separation filter of FIG. 6. The input to stage two of the filter comprises the stream of multiplexed data output by the filter of FIG. 6. Stage two comprises a switchable finite impulse response filter 146 and corresponding H/L select unit 148. The sets of tap coefficients used by the switchable finite impulse response filter 146 are an alternating mixture of high and low pass filter coefficients from conventional filters. The H/L select unit 148 switches between sets of coefficients at half the rate of the stream of source data that generated the stream of multiplexed data being processed, and the intertap delay of the switchable finite impulse response filter 146 is twice the period of the source data samples.

The alternating sequence of tap coefficients within each set and the summation of the derived tap values within the switchable finite impulse response filter 146 effectively also performs the task of padding the data, or at least rendering this unnecessary. The output from the switchable finite impulse response filter 146 is a stream of alternating high and low pass values from two sub band streams corresponding to the output of stage one in the filter of FIG. 6.

Stage one receives this stream of data and processes it in essentially the same manner as stage one. Stage one comprises another switchable finite impulse response filter 150 and H/L select unit 152. The H/L select unit 152 switches the tap coefficients of the switchable finite impulse response filter 150 at the same rate as the rate of the stream of source data and the intertap delay is equal to the source data period. The sets of tap coefficient values for the switchable finite impulse response filter 150 are the same as those for stage two, and again additional padding of the data is not required.

The output of the switchable finite impulse response filter 150 is fed to an output node 154 and comprises a stream of samples corresponding to the samples fed into the sub band filter of FIG. 6 at the input node 136.

FIGS. 8 to 11 illustrate the operation of stage one of FIG. 6 in more detail. The switchable finite impulse response filter includes a delay line with an intertap delay equal to the input sample period. The stream of input data values progress along the delay line as shown. Each data value from along the delay line is fed to a multiplier 156. The multipliers 156 generate an output equal to the product of the currently selected tap coefficient and the sample value. The outputs from the multipliers 156 are fed to an adder 158 where their sum is calculated. Each multiplier 156 is capable of applying one of two tap coefficient values in dependence upon the output of the H/L select unit 140. The values carried by each signal line within the switchable finite impulse response filter 138 are shown next to that line.

Looking at the sequence of FIGS. 8 to 11 it will be seen that the stream of input data progresses along the delay line and has alternating sets of tap coefficients applied to it. The outputs from the adder 158 represent the sample-by-sample multiplexed data values for the two sub band components.

FIGS. 12 to 15 illustrate the switchable finite impulse response filter 142 of stage two of FIG. 6 in more detail. The data input to this stage progresses along a delay line with double the intertap delay of the previous stage. Multipliers 160 output the product of every alternate input sample with the corresponding currently selected tap coefficient. The outputs from the multipliers 160 are fed to an adder 162 which calculates the output sample values corresponding to the four different sub band components multiplexed together within the data stream. Looking at the sequence of FIG. 12 to 15 it will be noted that the H/L select unit 144 switches the tap coefficient values at half the sample rate.

Figure 16:
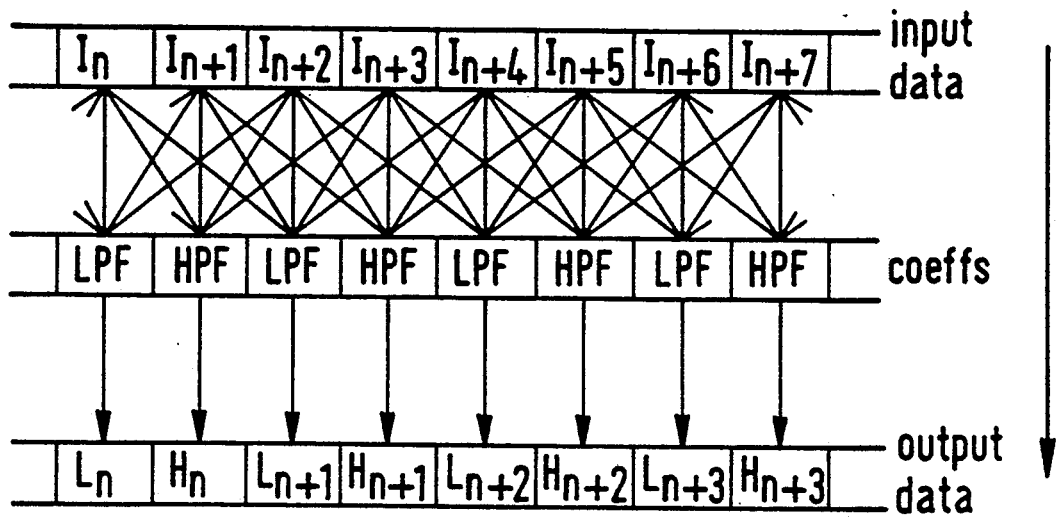
FIGS. 16 and 17 illustrate the overall relationship between the input data, the filter tap coefficients and the output data for stage one and stage two respectively of the sub band separation filter illustrated in FIG. 6.
Figure 17:
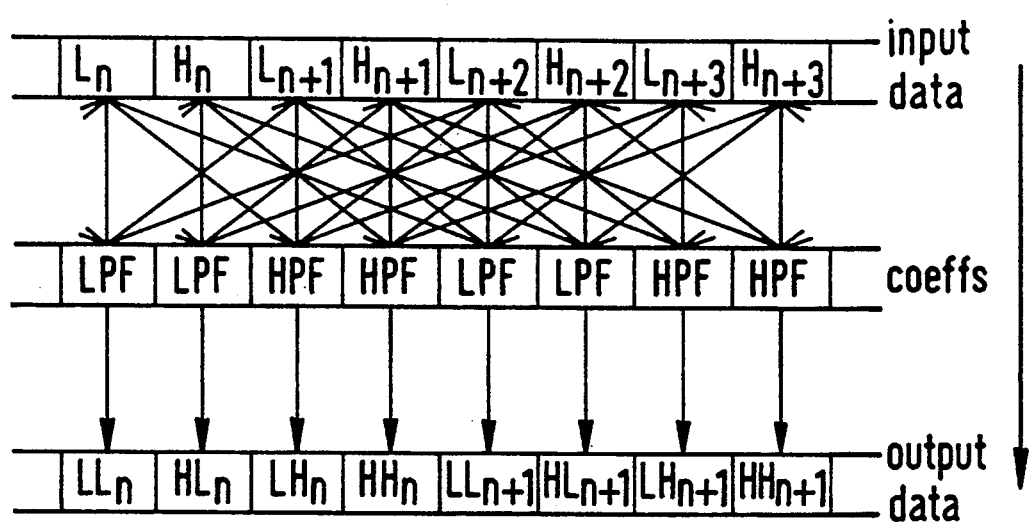
Figure 20:
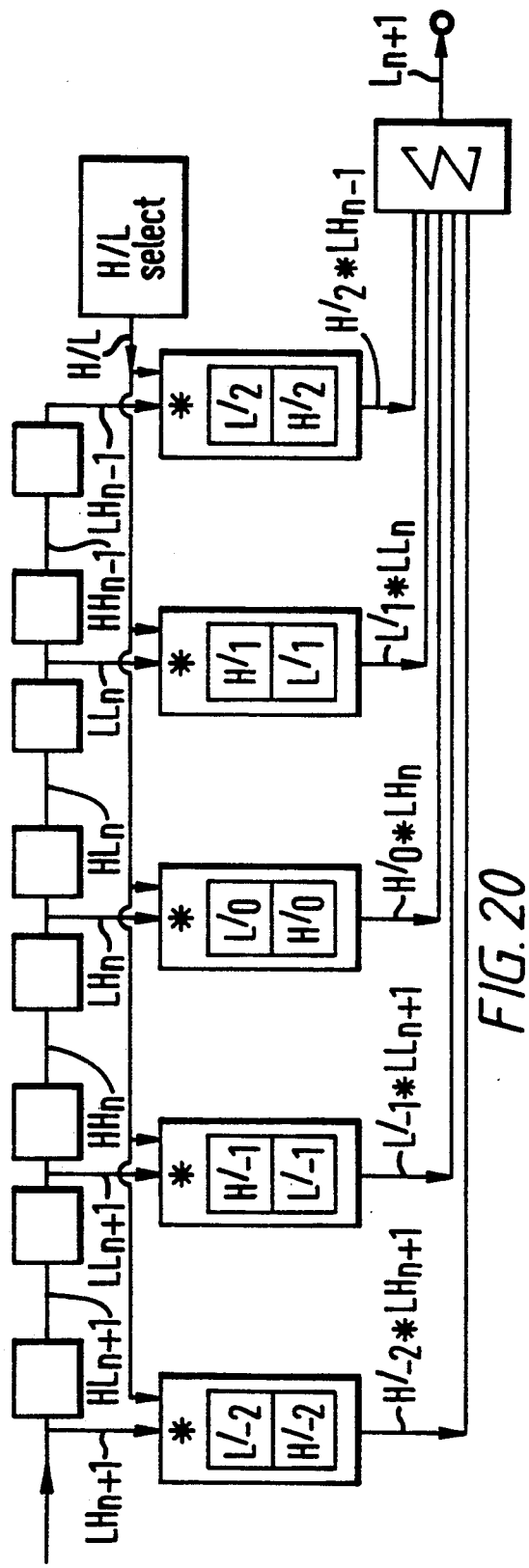
Figure 21:
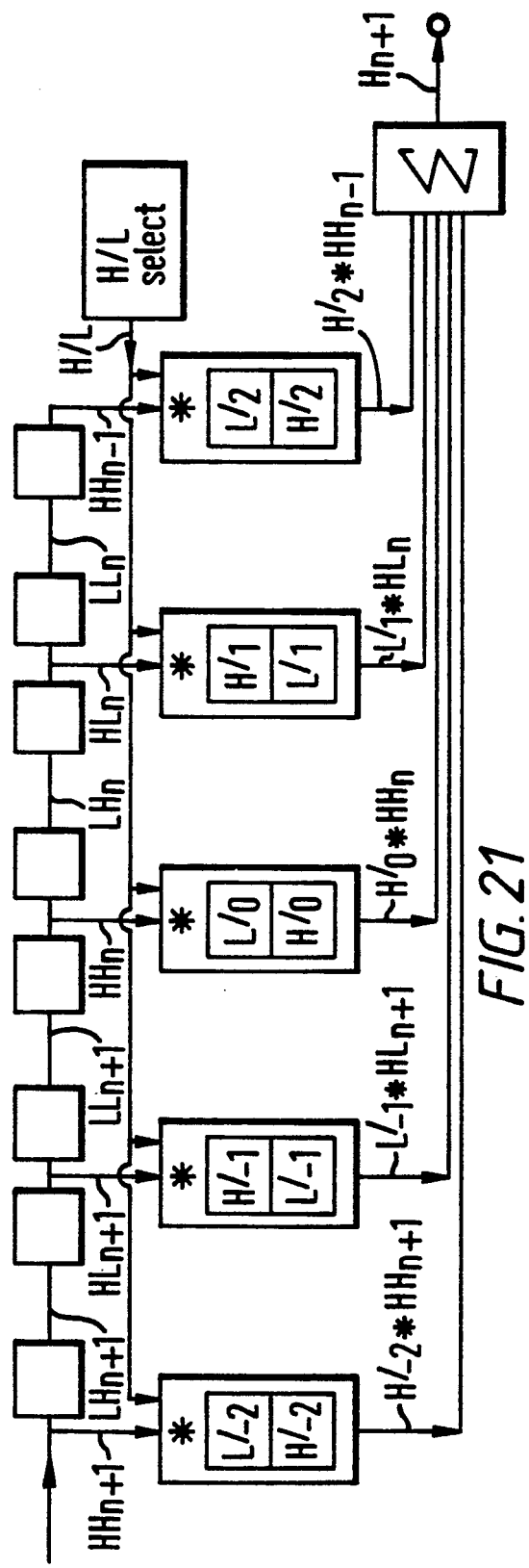
Figure 24:
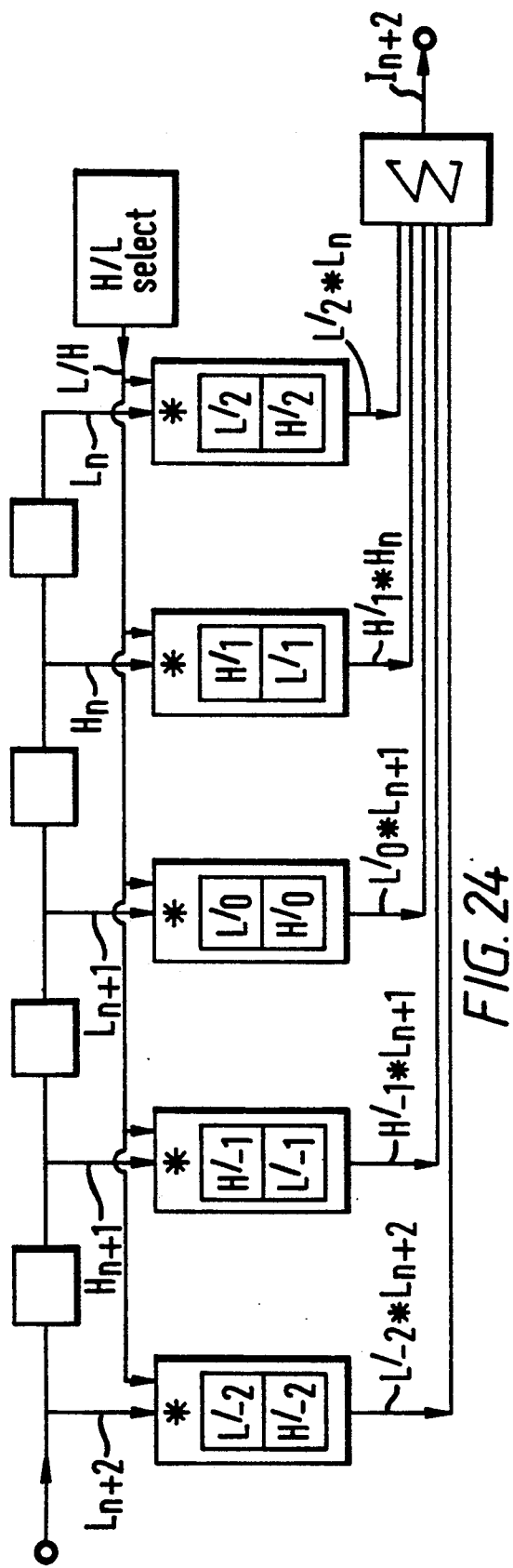
Figure 25:
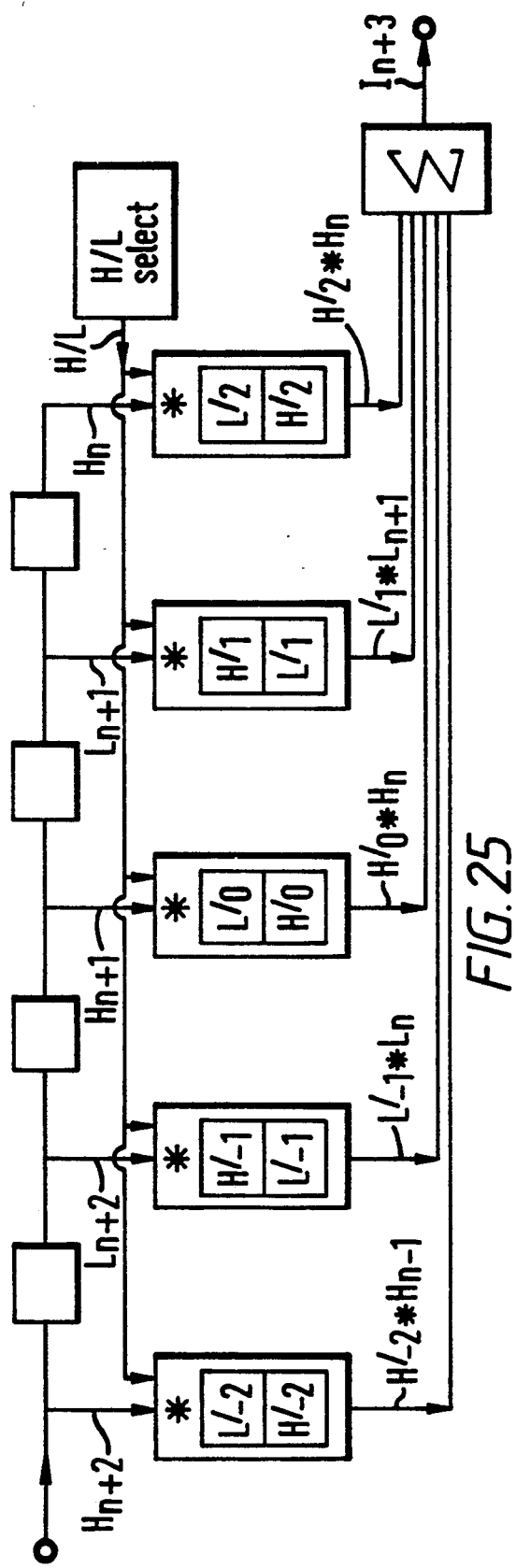

FIG. 16 illustrates the relationship between input data, tap coefficients and output data for stage one of the sub band separation filter of FIG. 6. FIG. 17 illustrates the relationship between input data, tap coefficients and output data for stage two of the sub band separation filter of FIG. 6. The differing intertap delays and switching rates of the tap coefficients can be observed by comparing the lines drawn between the input data row and coefficients row and by the values within the coefficients row.

FIGS. 18 to 21 illustrate stage two of the sub band combination filter of FIG. 7. As with stage two of the corresponding sub band separation filter, the intertap delay is twice the inter sample period. In contrast to the separation filter, the sets of tap coefficients which the H/L select unit 148 controls comprise alternating high and low values. A H/L select unit 148 output of L/H switches in even low pass coefficients $L_{-2}$, $L_0$, $L_2$ and odd high pass coefficients $H_{-2}$, $H_1$. An output of H/L switches in even high pass coefficients $H_{-2}$, $H_0$, $H_2$ and odd low pass coefficients $L_{-1}$, $L_1$. Looking through the sequence of FIGS. 18 to 21 it will be seen that the tap coefficients are changed at half the sample rate and that the output generated by the adder 166 represents the sample-by-sample multiplexed data values of two sub band components. This arrangement provides a data stream in which the high and low components have been reconstructed and added together within the finite impulse response filter itself without the need for another adder such as adders 50, 52 and 62 in FIG. 1.

FIGS. 22 to 25 show the switchable finite impulse response filter 150 from stage one of the sub band combination filter of FIG. 7 in more detail. The intertap delay is equal to the sample period. The H/L select unit 152 switches the tap coefficients at the sample rate. The sets of tap coefficients are alternating high and low tap coefficients as for stage two. The output from the adder 170 represents the data values of the stream of source data.

Figure 26:
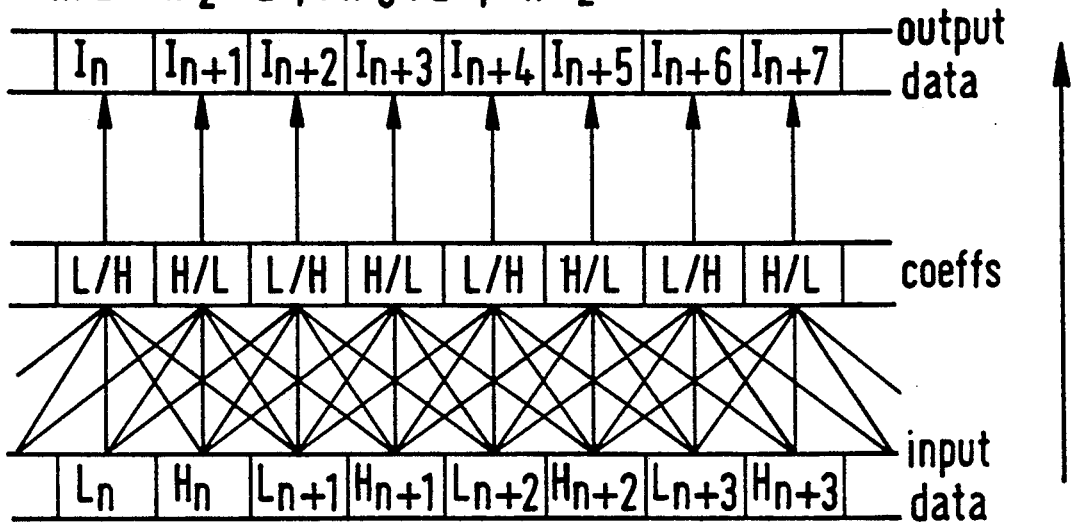
FIGS. 26 and 27 illustrate the overall relationship between the input data, the filter tap coefficients and the output data for stage one and stage two respectively of the sub band combination filter illustrated in FIG. 7.
Figure 27:
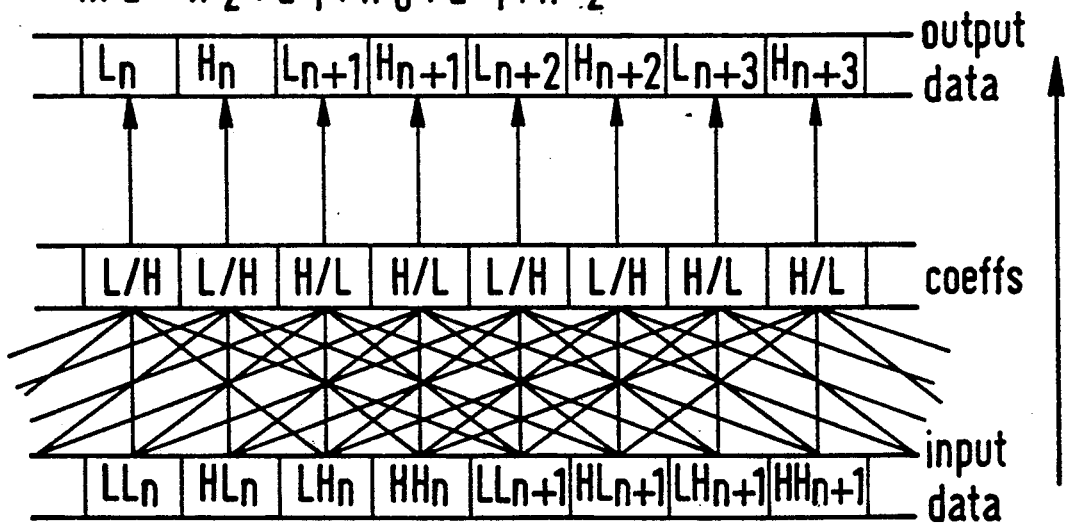

FIGS. 26 and 27 show the relationship between the input data, tap coefficients and output data for stage one and stage two of the sub band combination filter respectively. The rate of switching of the tap coefficients and intertap delays can be read as for FIGS. 16 and 17.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A sub-band separation filter comprising a plurality of filter stages, each of said filter stages including:
   means having one or more filter elements for separating a received stream of input data into frequency separated data representing different frequency components of said stream of input data; and
   means for multiplexing said frequency separated data to form a respective stream of multiplexed data;
   the respective stream of multiplexed data being supplied to a subsequent filter stage for receipt and processing thereat as respective input data.

2. A sub-band separation filter as in claim 1, wherein said means for separating includes a plurality of discrete filter elements for producing discrete streams of frequency separated data.

3. A sub-band separation filter as in claim 2, wherein said discrete filter elements are finite impulse response filters.

4. A sub-band separation filter as in claim 2, wherein said means for multiplexing includes a data store for storing said discrete streams of frequency separated data and means for reading a sequence of blocks of data originating from within different discrete streams of frequency separated data from said data store so as to form a stream of block multiplexed data.

5. A sub-band separation filter as in claim 2, further comprising decimator means disposed between each said discrete filter element and said means for multiplexing for removing a portion of the frequency separated data from the respective discrete stream.

6. A sub-band separation filter as in claim 1, wherein said means for separating includes a finite impulse response filter with a switchable set of tap coefficient values for effecting different frequency responses and said means for multiplexing includes means for switching said set of tap coefficient values between a periodic sequence of states to control said finite impulse response filter to produce the respective stream of multiplexed data with a matching periodic sequence of portions corresponding to different frequency components of the respective stream of input data.

7. A sub-band separation filter as in claim 6, wherein the finite impulse response filter of each said subsequent filter stage has an intertap delay substantially equal to an integer multiple of the period of the respective stream of multiplexed data being processed as the respective stream of input data.

8. A sub-band separation filter as in claim 6, wherein the switching means of each said subsequent filter stage switches said tap coefficient values in a sequence with a period substantially equal to an integer multiple of the period of the respective stream of multiplexed data being processed as the respective stream of input data.

9. A sub-band separation filter as in claim 1, in which the received stream of input data is a stream of image data.

10. A sub-band combination filter comprising one or more filter stages, each said filter stage including:
    means for demultiplexing a received stream of block multiplexed data formed of frequency separated data representing different frequency components of a stream of source data and arranged in a block format in which different blocks of data correspond to different discrete streams of said frequency separated data, said means for demultiplexing including a data stream switch for directing the flow of the received stream of block multiplexed data through said means for demultiplexing so as to form a plurality of discrete streams of block data each corresponding to a number of said blocks of data; and
    means including a plurality of discrete filter elements arranged for receiving corresponding block data streams from said means for demultiplexing for combining said block data streams into a stream of output data corresponding to said stream of source data.

11. A sub-band combination filter comprising a plurality of filter stages, each of said filter stages including:
    means for demultiplexing a received stream of multiplexed data formed of frequency separated data representing different frequency components of a stream of source data so as to form a plurality of respective streams of frequency separated data; and
    means including one or more filter elements for frequency combining the respective streams of frequency separated data into a respective stream of output data which is supplied to a subsequent filter stage for receipt and processing thereat as a respective stream of multiplexed data; in which the stream of output data from a last filter stage corresponds to said stream of source data.

12. A sub-band combination filter as in claim 11, wherein said means for combining includes a plurality of discrete filter elements for combining discrete streams of frequency separated data.

13. A sub-band combination filter as in claim 12, wherein said discrete filter elements are finite impulse response filters.

14. A sub-band combination filter as in claim 12, further comprising means for padding disposed between said means for demultiplexing and each said discrete filter element for padding said discrete streams of frequency separated data.

15. A sub-band combination filter as in claim 11, wherein said means for combining includes a finite impulse response filter with a switchable set of tap coefficient values for effecting different frequency responses and said means for demultiplexing includes means for switching said set of tap coefficient values between a periodic sequence of states matching a periodic sequence of portions of said stream of multiplexed data corresponding to different frequency components of said stream of source data so as to produce the respective stream of output data.

16. A sub-band combination filter as in claim 11, in which the stream of output data is a stream of image data.

17. A sub-band combination filter comprising a plurality of filter stages, each of said filter stages including:
means including a finite impulse response filter with a switchable set of tap coefficient values for effecting different frequency responses for receiving a respective stream of multiplexed data formed of frequency separated data representing different frequency components of a stream of source data; and
in which the stream of output data from a last filter stage corresponds to said stream of source data.

18. A sub-band combination filter as in claim 17, wherein the finite impulse response filter of each said subsequent filter stage has an intertap delay substantially equal to an integer fraction of the period of the respective stream of output data being processed as the respective stream of multiplexed data.

19. A sub-band combination filter as in claim 17, wherein the switching means of each said subsequent filter stage switches said tap coefficient values in a sequence with a period substantially equal to an integer fraction of the period of the respective stream of output data being processed as the respective stream of multiplexed data.

20. A sub-band separation method for use within each filter stage of a sub-band separation filter comprising a plurality of filter stages, said method comprising the steps of:
separating a received stream of input data into frequency separated data representing different frequency components of said stream of input data;
multiplexing said frequency separated data to form a respective stream of multiplexed data; and
supplying the respective stream of multiplexed data to a subsequent filter stage for receipt and processing thereat as respective input data.

21. A sub-band combination method for use within each filter stage of a sub-band combination filter comprising a plurality of filter stages, said method comprising the steps of:
demultiplexing a received stream of multiplexed data formed of frequency separated data representing different frequency components of a stream of source data so as to form a plurality of respective streams of frequency separated data;
combining the respective streams of frequency separated data into a respective stream of output data; and
supplying the respective stream of output data to a subsequent filter stage for receipt and processing thereat as a respective stream of multiplexed data;
in which the stream of output data from a last filter stage corresponds to said stream of source data.

* * * * *